US008753710B2

(12) United States Patent
Suzuki et al.

(10) Patent No.: US 8,753,710 B2
(45) Date of Patent: Jun. 17, 2014

(54) COATING METHOD

(75) Inventors: Toshinao Suzuki, Toyota (JP); Ikuo Chidai, Kariya (JP)

(73) Assignee: Toyota Jidosha Kabushiki Kaisha, Toyota-shi, Aichi-ken (KP)

( * ) Notice: Subject to any disclaimer, the term of this patent is extended or adjusted under 35 U.S.C. 154(b) by 0 days.

(21) Appl. No.: 13/487,328

(22) Filed: Jun. 4, 2012

(65) Prior Publication Data

US 2012/0315380 A1 Dec. 13, 2012

(30) Foreign Application Priority Data

Jun. 8, 2011 (JP) ................................ 2011-128050

(51) Int. Cl.
*C23C 16/52* (2006.01)

(52) U.S. Cl.
USPC ............................................. 427/8; 427/172

(58) Field of Classification Search
USPC ................. 427/549, 482, 172, 432.2, 8, 9, 10
See application file for complete search history.

(56) References Cited

U.S. PATENT DOCUMENTS

2007/0248745 A1* 10/2007 Wakai et al. .................... 427/10
2011/0097476 A1 4/2011 Ishizu et al.

FOREIGN PATENT DOCUMENTS

| | | | | |
|---|---|---|---|---|
| CN | 101883639 | | | 11/2010 |
| JP | 11090297 | A | * | 4/1999 |
| JP | 11223594 | A | * | 8/1999 |
| JP | 2000-353515 | | | 12/2000 |
| JP | 2007-258078 | | | 10/2007 |
| JP | 2009-172513 | | | 8/2009 |

* cited by examiner

*Primary Examiner* — Dah-Wei D Yuan
*Assistant Examiner* — Nga Leung V Law
(74) *Attorney, Agent, or Firm* — Finnegan, Henderson, Farabow, Garrett & Dunner, LLP

(57) ABSTRACT

A coating method for forming a coating film by discharging a coating solution from a coating die onto a surface of a substrate that is being conveyed includes detecting the pressure and flow rate of the coating solution in a circulation circuit through which the coating solution is circulated between the coating die and a supply tank for the coating solution, estimating the viscosity of the coating solution based on the pressure and flow rate detected, determining an initial value of a coating gap between the discharge port of the coating die and the substrate which is necessary to adjust the coating width of the coating die to a target value based on the correlation between the viscosity estimated and the coating width, and adjusting the coating gap to the initial value and starting the supply of the coating solution to the coating die.

5 Claims, 6 Drawing Sheets

COATING METHOD

INCORPORATION BY REFERENCE

The disclosure of Japanese Patent Application No. 2011-128050 filed on Jun. 8, 2011 including the specification, drawings and abstract is incorporated herein by reference in its entirety.

BACKGROUND OF THE INVENTION

1. Field of the Invention

The present invention relates to a coating method for applying a coating solution to a surface of a substrate that is being conveyed.

2. Description of Related Art

In recent years, electricity-powered vehicles that are equipped with a motor as a driving source, such as hybrid vehicles and electrical vehicles, are spreading. The electricity-powered vehicle is equipped with a rechargeable secondary battery. Electrodes that include a strip-shaped metal foil (substrate) and a coating film that is formed on a surface of the substrate by applying a coating solution that contains an active material, a conductive aid, a binder and so on and drying the coating solution are used in a secondary battery. In a secondary battery, a positive-electrode active material that is contained in the coating film on a positive plate and a negative-electrode active material that is contained in the coating film on a negative plate occlude or release ions during charge or discharge. For appropriate occlusion and release of ions, a coating film with an appropriate coating width (length in the direction of the width of the substrate) has to be formed on a surface of respective positive and negative plates.

A coating device is known in which a coating solution is discharged onto a surface of a substrate that is being conveyed by a backup roll from a coating die which is located opposite the backup roll to form a coating. The coating width of the coating film that is formed by the coating die depends on the gap between the discharge port of the coating die and the substrate (coating gap). Thus, Japanese Patent Application Publication No. 2007-258078 (JP 2007-258078 A), for example, discloses a coating method that includes measuring the coating width of the coating solution that is applied by a coating die and adjusting the coating gap by feedback control based on the result of comparison between the coating width measured and a target value. According to this coating method, the coating gap is controlled in a feedback manner based on the coating width measured to adjust the coating width to a target value.

However, the method that is disclosed in JP 2007-258078 A has the following problem. In general, the coating solution that is discharged from a coating die is drawn from a supply tank by a pump or the like and supplied to the coating die through a supply circuit. When the coating gap is changed, the pressure or flow rate of the coating solution that flows through the supply circuit changes accordingly. When the pressure or flow rate of the coating solution that is supplied to the coating die changes, the coating width changes again by virtue of the change in the pressure or flow rate. Thus, even when the coating gap is adjusted based on the coating width measured as described in JP 2007-258078 A, the pressure or flow rate of the coating solution changes by virtue of the change in the coating gap, resulting in the coating width deviating from the target value. In this case, the coating width can be adjusted to a target value by correcting the deviation of the coating width by repetitively controlling the coating gap in a feedback manner. However, it takes as long as approximately 3 to 5 minutes to stabilize the coating width at a target value.

A coating line of this type is usually operated continuously 24 hours a day, and there are a few occasions a year where the production line is stopped and then started again. Thus, it would not matter even if it takes a bit of time to start the coating line again. However, when the coating line is stopped every evening and restarted every morning, or when the coating line is operated continuously 24 hours from Monday to Friday and stopped on Saturday and Sunday, for example, it is strongly desired to stabilize the coating conditions (coating width and pressure or flow rate of the coating solution) quickly at the start of coating. This is because the coating line is operated on a trial basis until the coating conditions are stabilized at the start of the production line. Waste products that are produced during the trial operation increase and the production cost increases unless the coating conditions are stabilized quickly. With the method that is disclosed in JP 2007-258078 A, it takes approximately 3 to 5 minutes and 100 m or more of coated substrate should be disposed of before the coating width is stabilized by feedback control. Doing this every week results in an increase in production cost.

SUMMARY OF THE INVENTION

The present invention provides a coating method which can reduce waste products during trial phase by quickly stabilizing the coating width at a target value.

An aspect of the present invention relates to a coating method. In this coating method, a coating film is formed by discharging a coating solution from a coating die onto a surface of a substrate that is being conveyed. The coating method includes the steps of detecting the pressure and flow rate of the coating solution in a circulation circuit through which the coating solution is circulated between the coating die and a supply tank for the coating solution, estimating the viscosity of the coating solution based on the pressure and flow rate detected, determining an initial value of a coating gap between the discharge port of the coating die and the substrate which is necessary to adjust the coating width of the coating die to a target value based on the correlation between the viscosity estimated and the coating width, and adjusting the coating gap to the initial value and starting the supply of the coating solution to the coating die.

According the above coating method, the extent to which the coating gap should be changed after the start of the supply of coating solution to the coating die can be reduced in advance, and the coating width can be quickly stabilized at a target value.

The applicant found in an experiment that the coating width approximates a function between the coating gap (μm) and the viscosity (mPas) of the coating solution. On the other hand, it is known that the viscosity of a coating solution changes over time depending on the production lot of the coating solution and the time that has elapsed after the coating solution is kneaded, but it is difficult to calculate the viscosity of a coating solution theoretically. In particular, it is further difficult to obtain the average viscosity of the entire coating solution in a tank because the viscosity of coating solution that has been stored in a tank may be significantly different between upper and lower layers. The applicant also found in an experiment, in which the pressure and flow rate of a coating solution that was circulated through a specific circulation circuit were measured, that the viscosity of the coating solution can be estimated fairly accurately based on the pressure and flow rate. At this time, the applicant found in an experiment that the average viscosity of coating solution in the tank can be estimated when a certain amount of coating solution is circulated through the circulation circuit. Thus, the coating width can be quickly stabilized at a target value and the amount of waste products can be significantly reduced by a method that includes the steps of circulating the coating solution through a circulation circuit before starting coating, estimating the viscosity of coating solution, determining an initial value of the coating gap based on the estimated value of viscosity, and starting the coating line with the coating gap adjusted to the initial value when the coating line is restarted.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
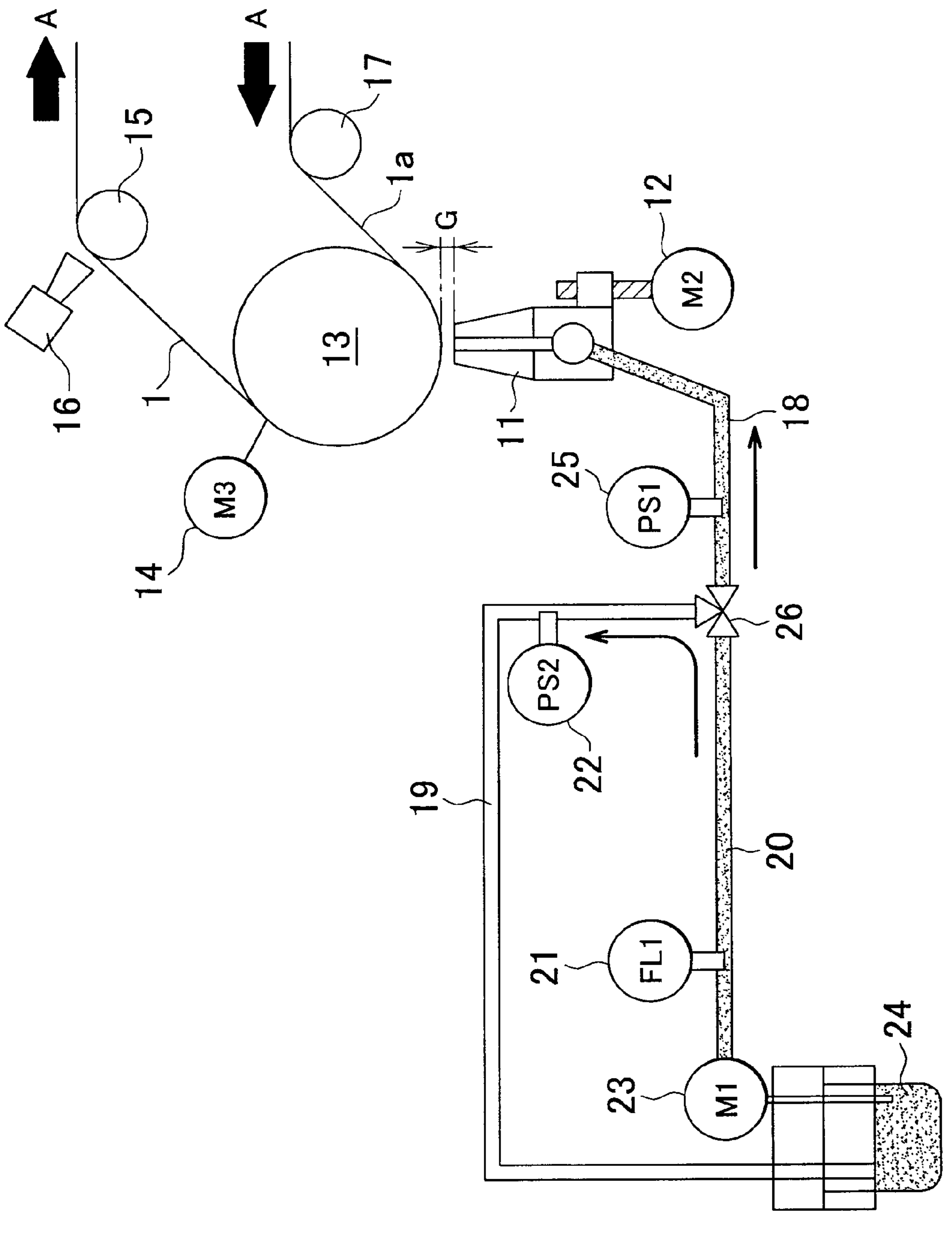
FIG. 1 is a cross-sectional view that illustrates the general configuration of a coating control system according to this embodiment.

Description is hereinafter made of an embodiment that embodies a coating control system according to the present invention in detail with reference to accompanying drawings. The coating control system of this embodiment controls a coating die 11 which is used to apply a coating solution 2 to a surface of a substrate 1 for an electrode in the process of producing a lithium ion secondary battery for an electric vehicle. The general configuration of a coating system according to this embodiment is first described with reference to FIG. 1. FIG. 1 is a conceptual diagram that illustrates the general configuration of a coating system according to this embodiment.

Figure 7:
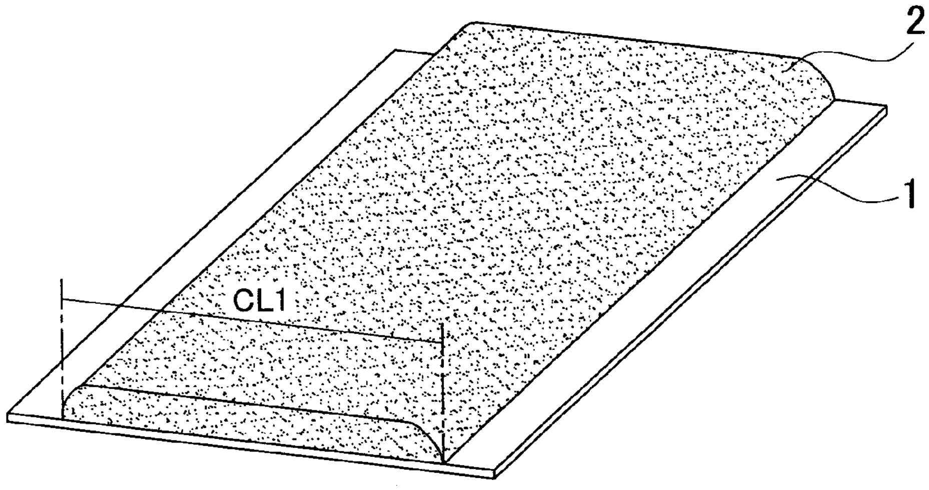
FIG. 7 is an explanatory view of a coating width CL.

The coating die 11 is a device that discharges a coating solution 2 from a fountain groove that is formed in the top face thereof to form a gap between the top face and a coating surface 1*a* of the substrate 1, and applies the coating solution 2 to the coating surface 1*a* of the substrate 1 using the gap. The substrate 1 is held in close contact with an outer periphery of a backup roll 13 above the top face of the coating die 11 with a gap that has a gap width G therebetween. The backup roll 13 is rotated clockwise by a motor 14, and the substrate 1 is conveyed in the direction that is indicated by arrows A by another drive means. As the substrate 1 in this embodiment, a metal foil, such as aluminum foil or copper foil, is used. As the coating solution 2, a paste-like coating material which contains an active material, a conductive aid, a binder and so on is used. FIG. 7 is a perspective view that illustrates a part of the coating solution 2 that has been applied to the substrate 1. The coating width CL is the width of the coating solution 2 that has been applied to the substrate 1. While the coating width CL is eventually managed as a width of the coating material in a dry form, the width of the coating solution 2 in the state after coating and before drying is managed as the coating width CL. A driven roll 17 is provided upstream of the backup roll 13 to support the substrate 1. A driven roll 15 is provided downstream of the backup roll 13 to support the substrate 1. A coating width measuring camera 16 is located opposite where the driven roll 15 supports the substrate 1. The coating width measuring camera 16 measures the width of the coating solution 2 in real time and sends the measurement data to a central control unit.

The coating die 11 is supported for movement toward and away from the central axis of the backup roll 13. A coating die moving motor 12 which can accurately move the coating die 11 in microns is attached to the coating die 11. An end of a supply circuit 18 through which the coating solution 2 is supplied is connected to the coating die 11. A supply circuit pressure sensor 25 is attached to a middle portion of the supply circuit 18. The other end of the supply circuit 18 is connected to a second port of a changeover valve 26, which is a three-way valve. A first port of the changeover valve 26 is connected by a common circuit 20 to the discharge port of a mono pump 23 which is driven by a servomotor. The mono pump 23 can deliver a precise amount of coating solution 2. The input port of the mono pump 23 is connected to a tank 24 that stores the coating solution 2. A flow rate sensor 21 is attached to the common circuit 20. A third port of the changeover valve 26 is directly connected to the tank 24 by a circulation circuit 19. A circulation circuit pressure sensor 22 is attached to a middle portion of the circulation circuit 19. The coating solution 2 in the form of a paste, which is prepared by kneading a mixture of an active material, a conductive aid, a binder, a solvent and so on, is stored in the tank 24. The tank 24 can contain the coating solution 2 in an amount sufficient for several batches. A batch is a quantity of coating solution 2 sufficient to coat several thousand meters of the substrate 1. The viscosity V of the coating solution 2 may vary by approximately 50% depending on the materials or the time that has elapsed after kneading.

The effect of the coating system with the above configuration is next described. A case where the coating line was stopped and the coating die 11 was cleaned on Friday evening is described as an example. Suppose that an amount of the coating solution 2 corresponding to one batch was still in the tank 24 at this time. The viscosity of the coating solution 2 may have increased by approximately 50% when the coating line is restarted on Monday morning. When the coating line is restarted in this state, it takes 3 to 5 minutes until the coating width CL is stabilized by feedback control and a hundred meters or more of coated substrate may be disposed of. Disposing of substrate every Monday morning leads to an increase in production cost. In contrast, in the coating system of this embodiment, the first port (the common circuit 20) and the third port (the circulation circuit 19) of the changeover valve 26 are first communicated with each other and the mono pump 23 is then actuated so that the coating solution 2 can be drawn from the tank 24 and circulated through the common circuit 20, the changeover valve 26 and the circulation circuit 19 back into the tank 24. This state is referred to as "circulation circuit state." The flow rate sensor 21 measures the flow rate F in the circulation circuit state, and the circulation circuit pressure sensor 22 measures the pressure P in the circulation circuit state.

Figure 2:
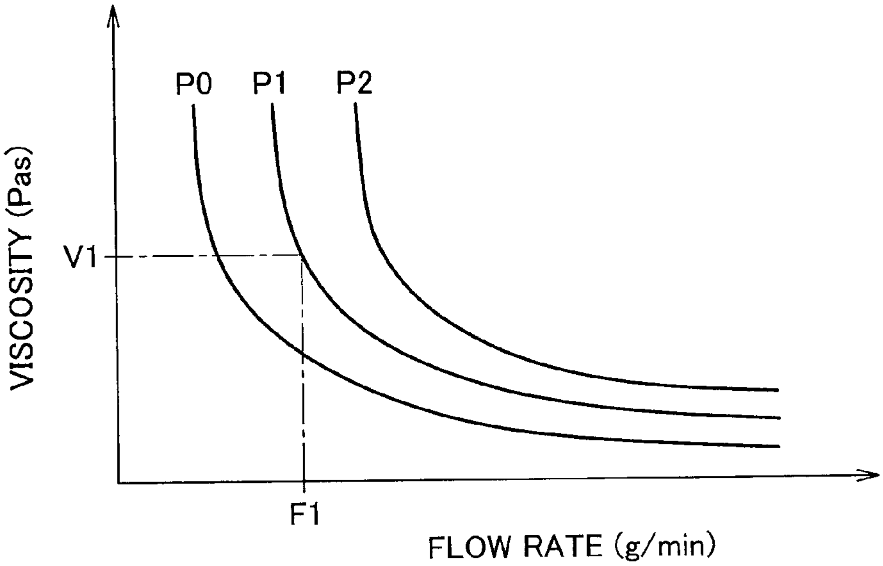
FIG. 2 is a graph that shows the relationship among flow rate, pressure and viscosity in a circulation circuit state.

FIG. 2 is a graph that shows the relationship among flow rate, pressure and viscosity in the circulation circuit state. The horizontal axis of the graph represents the flow rate (unit: g/min) of the coating solution 2, and the vertical axis represent the viscosity (unit: Pas) of the coating solution 2. The curve P0 is a pressure curve in the case where the pressure that is measured by the circulation circuit pressure sensor 22 is P0, the curve P1 is a pressure curve in the case where the pressure is P1, and the curve P2 is a pressure curve in the case where the pressure is P2. The data are obtained in an experiment. First, the pressure P in the circulation circuit state is read from the circulation circuit pressure sensor 22 and a pressure curve P for a pressure that is closest to the pressure value is selected. For example, the pressure curve P1 is selected when the pressure value is P1. When the pressure value measured is somewhere between P1 and P2, an intermediate value is obtained by an approximation method. Then, the flow rate F is read from the flow rate sensor 21. Suppose that the flow rate reading is F1 (for example, 400 g/min), for example. As shown in FIG. 2, a viscosity V1 (for example, 400 mPas) corresponding to the flow rate F1 is obtained from the pressure curve P1. In this way, the current viscosity V1 (400 mPas) of the coating solution 2, which have been stored for three days, can be estimated.

Figure 3:
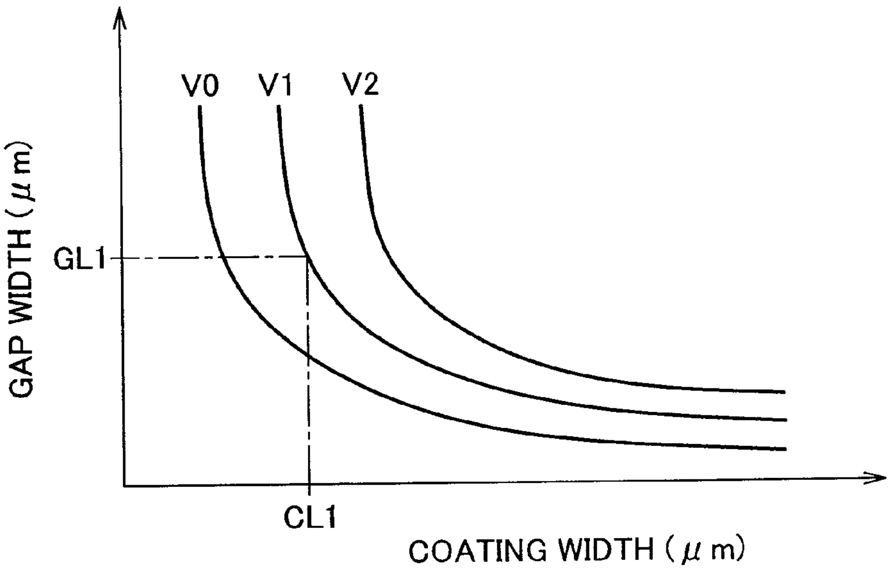
FIG. 3 is a graph that shows the relationship among coating width, viscosity and gap width.

FIG. 3 is a graph that shows the relationship among coating width CL, viscosity V and gap width G. The horizontal axis of the graph represents the coating width CL (unit: μm) and the vertical axis represents the gap width G (unit: μm). The coating width CL here is the difference from the overall required width. The gap width G has a maximum value between 100 and 200 μm, and is adjustable in microns by the coating die moving motor 12 in this embodiment. The curve V0 is a viscosity curve in the case where the estimated viscosity is V0, the curve V1 is a viscosity curve in the case where the estimated viscosity is V1, and the curve V2 is a viscosity curve in the case where the estimated viscosity is V2. First, a viscosity curve for a viscosity that is closest to the estimated viscosity is selected from FIG. 2. Then, a desired coating width CL is determined. Suppose that the desired coating width CL is CL1 (for example, the required width is 100 mm and the difference from the required width is 100 μm), for example. The desired coating width CL is a value that is given separately. As shown in FIG. 3, if the coating width is CL1 (100 μm), GL1 (for example, 80 μm) is obtained as the gap width G from the viscosity curve V1 (400 mPas).

Then, the coating die moving motor 12 is driven to adjust the gap width G between the outer surface of the substrate 1, which is held in close contact with an outer periphery of the backup roll 13, and the top face of the coating die 11 to GL1 (80 μm). Then, the changeover valve 26 is switched to communicate the first port (the common circuit 20) and the second port (the supply circuit 18) thereof. The motor 14 is driven to rotate the backup roll 13 in order to start feeding the substrate 1. As a result, the coating solution 2 is applied to a surface of the substrate 1 through the supply circuit 18 and the coating die 11. The coating width CL is continuously measured by the coating width measuring camera 16.

As described above, the coating method according to this embodiment is a coating method for forming a coating film by discharging a coating solution 2 from a coating die 11 onto a surface of a substrate 1 that is being conveyed. The coating method includes the steps of detecting the pressure P1 and flow rate F1 of the coating solution 2 in the circulation circuits 19 and 20, respectively, through which the coating solution 2 is circulated between the coating die 11 and the tank 24 for the coating solution 2, estimating the viscosity V1 of the coating solution 2 based on the pressure P1 and flow rate F1 detected, determining an initial value GL1 of the coating gap G between the discharge port of the coating die 11 and the substrate 1 which is necessary to adjust the coating width CL to a target value based on the correlation between the viscosity V1 estimated and the coating width CL of the coating die 11, and adjusting the coating gap G to the initial value GL1 and starting the supply of the coating solution 2 to the coating die 11. Therefore, the extent to which the coating gap G should be changed after the start of the supply of the coating solution 2 to the coating die 11 can be reduced in advance, and the coating width CL can be quickly stabilized at a target value.

The applicant found in an experiment that the coating width CL approximates a function between the coating gap G and the viscosity V (mPas) of the coating solution 2. The applicant also found in an experiment, in which the pressure P1 and flow rate F1 of a coating solution 2 that was circulated through specific circulation circuits 19 and 20 were measured, that the viscosity V1 of the coating solution 2 can be estimated fairly accurately based on the pressure P1 and the flow rate F1. Thus, the coating width CL can be quickly stabilized at a target value and the amount of waste products can be significantly reduced by a method that includes the steps of circulating the coating solution 2 through the circulation circuits 19 and 20 before starting coating, estimating the viscosity V1 of the coating solution 2, determining an initial value GL1 of the coating gap G based on the estimated value V1 of the viscosity V, and starting the coating line with the coating gap G adjusted to the initial value GL1 when the coating line is restarted.

Figure 4:
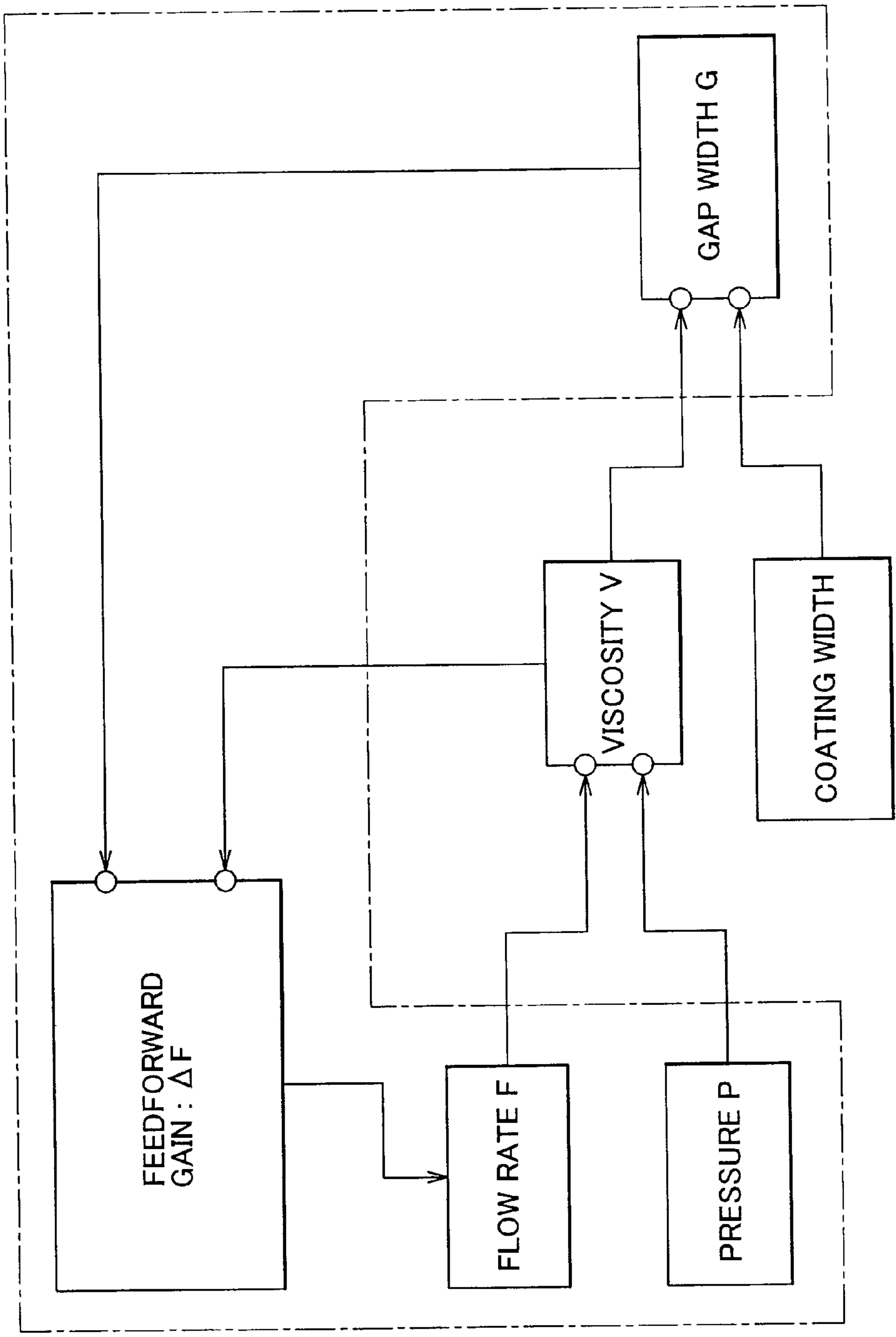
FIG. 4 is a control block diagram.
Figure 8A:
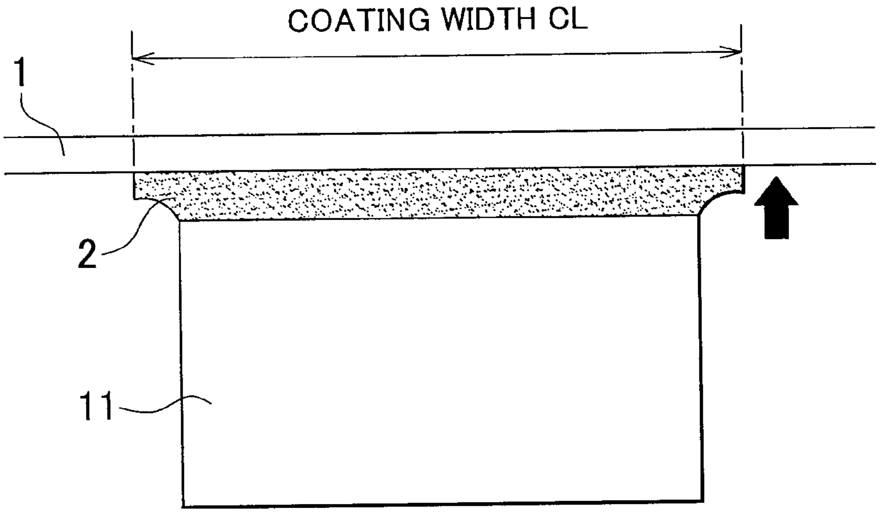
FIGS. 8A and 8B are diagrams that illustrate the relationship between coating width CL and gap width G.
Figure 8B:
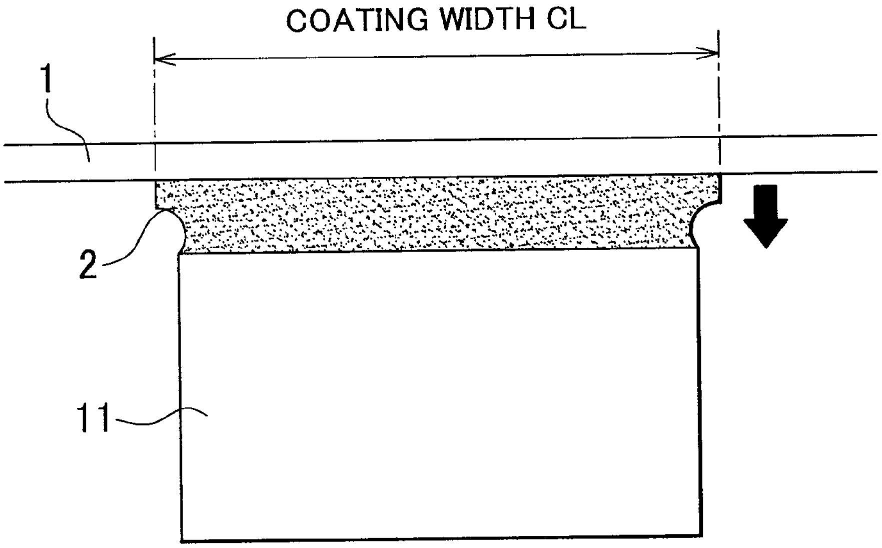

The management control of the coating width CL during operation is next described. FIG. 4 shows a control block diagram. The gap width G is determined by the viscosity V and the coating width CL. The viscosity V can be determined by the flow rate F and the pressure P. The flow rate F is controlled in a feedforward manner (gain ΔF) based on the gap width G and the viscosity V. When the coating width CL of the coating solution 2 is smaller than a reference value by a predetermined value or more, the coating die moving motor 12 is driven to decrease the gap width G as shown in FIG. 8A. Then, the coating width CL increases and approaches the reference value. On the contrary, when the coating width CL is greater than a reference value by a predetermined value or more, the coating die moving motor 12 is driven to increase the gap width G as shown in FIG. 8B. Then, the coating width CL decreases and approaches the reference value. On the other hand, because the amount of the coating solution 2 applied changes when the gap width G is changed, the pressure P, which is measured by the supply circuit pressure sensor 25, and the flow rate F, which is measured by the flow rate sensor 21, change accordingly. At this time, in this embodiment, when the gap width G is increased to a gap width GL2, for example, the command value to the mono pump 23 is changed to change the flow rate F to a flow rate F2, a value suitable for the gap width GL2, at the same time as the gap width G is changed to a gap width GL2 without waiting for feedback control of the coating width CL. In other words, feedforward control is performed.

Figure 5:
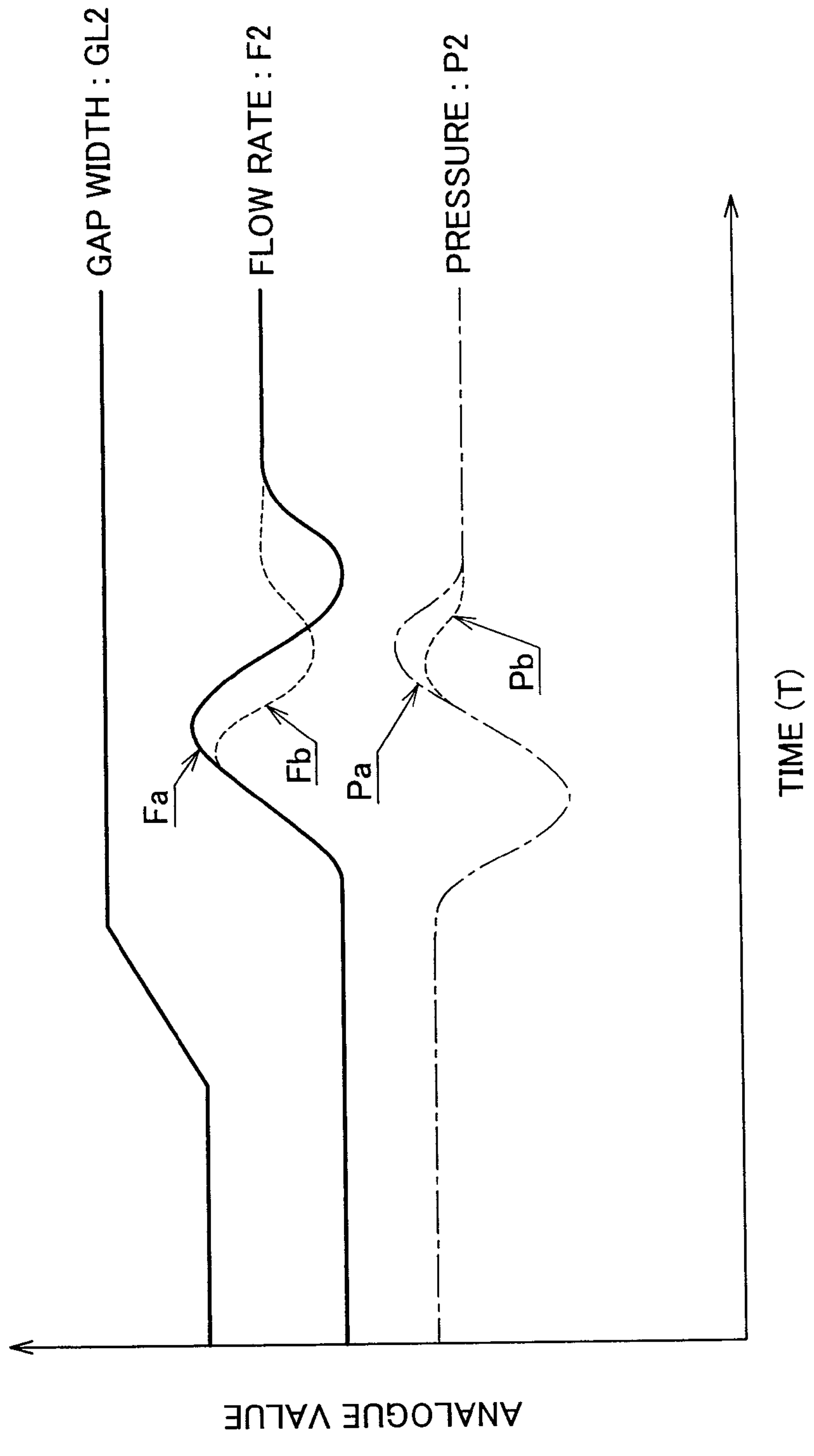
FIG. 5 is a diagram that illustrates an effect of coating width control.

The effect of the feedforward control is shown in FIG. 5. In the related art, the flow rate F is controlled in a feedback manner and therefore shows large fluctuations Fa before converging to the flow rate F2. In this embodiment, however, the flow rate F is directly adjusted to a flow rate F2 by feedforward control and therefore exhibits only small fluctuations Fb before converging to the flow rate F2. Because the flow rate converges to the flow rate F2 with small fluctuations, the pressure P can be also converged with smaller fluctuations Pb than the fluctuations Pa in the case of feedback control. The coating method of this embodiment includes the steps of measuring the coating width CL of the coating film that has been formed by the coating die 11 with the coating width measuring camera 16 and controlling the coating gap G in a feedback manner, and changing the flow rate F of the coating solution 2 by feedforward control in adjusting the coating gap G. Thus, the coating width CL can be quickly stabilized at a target value because the change in the flow rate F of the coating solution 2 by virtue of a change in the coating gap G can be quickly compensated for.

Figure 6:
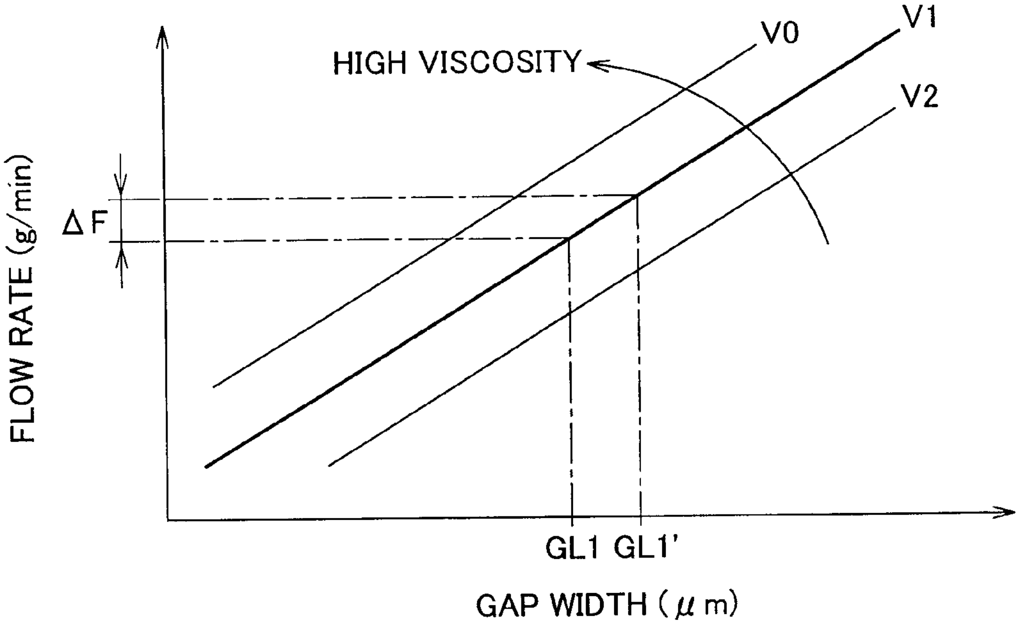
FIG. 6 is a graph that shows the relationship among viscosity V, gap width G and flow rate F.

The following control is preferably added to the control that is shown in FIGS. 4 and 5. The pressure P is not only affected by the gap width G but also affected significantly by the viscosity V of the coating solution 2. Thus, when the estimated viscosity V1 in the circulation circuit 19 is greater than a predetermined value, compensation is preferably made according to the following procedure. FIG. 6 is a graph that shows the relationship among viscosity V, gap width G and flow rate F. The horizontal axis represents the gap width G (unit: μm), and the vertical axis represents the flow rate F (unit: g/min). The curve V0 is a viscosity curve in the case where the viscosity is V0, the curve V1 is a viscosity curve in the case where the viscosity is V1, and the curve V2 is a viscosity curve in the case where the viscosity is V2. The viscosity curves V2, V1 and V0 are in ascending order of viscosity. When the estimated viscosity V is a viscosity V1, a gain ΔF that is shown in FIG. 6 (a change in flow rate in the case where the estimated viscosity is a viscosity V1) is preferably used as the gain ΔF in the feedforward control of the flow rate F that is performed as shown in FIGS. 4 and 5 when the gap width G is changed from GL1 to GL1'. This method includes steps of determining the extent to which the flow rate F should be changed based on the estimated viscosity V1 and the change in the coating gap G from the initial value GL1. Thus, because the extent to which the flow rate should be changed to compensate for the change in the flow rate can be determined easily and quickly, the coating width CL can be quickly stabilized at a target value.

It should be appreciated that the above embodiment and its modifications are shown only for illustrative purposes and are not intended to limit the present invention, and various changes or modifications may be made without departing the gist of the present invention. For example, while the circulation circuit 19 is provided with the circulation circuit pressure sensor 22 and the supply circuit 18 is provided with the supply circuit pressure sensor 25 in this embodiment, the supply circuit pressure sensor 25 may be omitted when the common circuit 20 is provided with the circulation circuit pressure sensor 22. While the relationship among flow rate, pressure and viscosity in the circulation circuit state is stored in the form of a graph in this embodiment, an approximate expression may be stored so that the viscosity can be obtained by calculation. Similarly, the relationship among coating width, viscosity and gap width may be stored in the form of an approximate expression so that the gap width can be obtained by calculation. While a viscosity is once estimated in this embodiment, the same result can be achieved when the gap width may be directly determined as a function of the flow rate, pressure and coating width in the circulation circuit state. This is because the viscosity is considered to be estimated based on the flow rate and pressure even when such a calculation formula is used. While the coating width is measured with the coating width measuring camera 16 in this embodiment, an optical sensor of a different type or a film thickness sensor may be used.

What is claimed is:

1. A coating method for forming a coating film by discharging a coating solution from a coating die onto a surface of a substrate that is being conveyed, comprising the steps of:
- detecting the pressure and flow rate of the coating solution in a circulation circuit through which the coating solution is circulated between the coating die and a supply tank for the coating solution,
- estimating the viscosity of the coating solution based on the pressure and flow rate detected,
- determining, based on the correlation between the viscosity estimated and coating width of the coating die, an initial value of a coating gap between the discharge port of the coating die and the substrate which is necessary to adjust the coating width to a target value,
- adjusting the coating gap to the initial value and starting the supply of the coating solution to the coating die, and
- changing the flow rate of the coating solution by feedforward control in adjusting the coating gap.

2. The coating method according to claim 1,
further comprising the step of measuring the coating width of the coating film that has been formed by the coating die and controlling the coating gap in a feedback manner.

3. The coating method according to claim 2,
wherein the coating gap is decreased when the coating width is smaller than a reference value by a predetermined value or more.

4. The coating method according to claim 2,
wherein the coating gap is increased when the coating width is greater than a reference value by a predetermined value or more.

5. The coating method according to claim 2,
further comprising the step of determining the extent to which the flow rate is changed based on the viscosity estimated and the change in the coating gap from the initial value.

* * * * *